(12) United States Patent
Perry et al.

(10) Patent No.: US 7,290,237 B2
(45) Date of Patent: Oct. 30, 2007

(54) METHOD FOR PROGRAMMING A MASK-PROGRAMMABLE LOGIC DEVICE AND DEVICE SO PROGRAMMED

(75) Inventors: Steven Perry, High Wycombe (GB); Gregor Nixon, Bicester (GB); Larry Kong, Bicester (GB); Alasdair Scott, High Wycombe (GB); Andrew Hall, High Wycombe (GB); Lingli Wang, High Wycombe (GB); Chris Dettmar, Headington (GB); Jonathan Park, San Jose, CA (US); Richard Price, San Jose, CA (US)

(73) Assignee: Altera Corporation, San Jose, CA (US)

( * ) Notice: Subject to any disclaimer, the term of this patent is extended or adjusted under 35 U.S.C. 154(b) by 239 days.

(21) Appl. No.: 10/875,256

(22) Filed: Jun. 23, 2004

(65) Prior Publication Data

US 2004/0261052 A1 Dec. 23, 2004

Related U.S. Application Data

(60) Provisional application No. 60/480,917, filed on Jun. 23, 2003, provisional application No. 60/483,525, filed on Jun. 26, 2003.

(51) Int. Cl.
*G06F 17/50* (2006.01)
(52) U.S. Cl. .......................................... 716/17; 716/18
(58) Field of Classification Search .................... 716/4, 716/12, 17; 714/726, 724; 438/129; 326/41
See application file for complete search history.

(56) References Cited

U.S. PATENT DOCUMENTS

| 5,068,603 | A | * | 11/1991 | Mahoney ...................... 714/726 |
| 5,212,652 | A | | 5/1993 | Agrawal et al. ............ 364/489 |
| 5,526,278 | A | * | 6/1996 | Powell ......................... 716/16 |
| 5,550,839 | A | * | 8/1996 | Buch et al. .................. 714/724 |
| 5,717,928 | A | * | 2/1998 | Campmas et al. ............ 716/17 |
| 5,815,405 | A | * | 9/1998 | Baxter ........................... 716/3 |

(Continued)

OTHER PUBLICATIONS

Mehendale, M., "A System for Behavior Extraction from FPGA Implementations of Synchronous Designs," *IEEE Proceedings, The Fifth International Conference on VLSI Design*, Jan. 4-7, 1992, pp. 320-321.

(Continued)

*Primary Examiner*—Leigh M. Garbowski
(74) *Attorney, Agent, or Firm*—Ropes & Gray LLP; Jeffrey H. Ingerman

(57) ABSTRACT

A user logic design for a mask-programmable logic device ("MPLD") may be designed on a comparable or compatible user-programmable logic device ("UPLD") and migrated to the MPLD, or may be designed directly on an MPLD. If the design is designed on a UPLD, the constraints of the target MPLD—i.e., differences between the devices—are taken into account so that the migration will be successful. If the design is designed directly on an MPLD, constraints of a comparable compatible UPLD are taken into account if the user indicates that the design will be migrated to the UPLD for testing. This means that when a logic design is intended to be migrated back-and-forth between a UPLD and an MPLD, only the intersection of features can be used. To facilitate migration, fixed mappings between pairs of devices may be created.

37 Claims, 6 Drawing Sheets

U.S. PATENT DOCUMENTS

| | | | | |
|---|---|---|---|---|
| 5,825,202 A | 10/1998 | Tavana et al. | ............... | 326/39 |
| 5,874,834 A | 2/1999 | New | ............... | 326/39 |
| 5,946,478 A * | 8/1999 | Lawman | ............... | 716/17 |
| 6,091,262 A | 7/2000 | New | ............... | 326/39 |
| 6,094,065 A | 7/2000 | Tavana et al. | ............... | 326/39 |
| 6,177,844 B1 | 1/2001 | Sung et al. | ............... | 331/25 |
| 6,242,945 B1 | 6/2001 | New | ............... | 326/39 |
| 6,311,316 B1 * | 10/2001 | Huggins et al. | ............... | 326/41 |
| 6,486,702 B1 | 11/2002 | Ngai et al. | ............... | 326/40 |
| 6,490,707 B1 | 12/2002 | Baxter | ............... | 716/2 |
| 6,492,833 B1 * | 12/2002 | Asson et al. | ............... | 326/41 |
| 6,515,509 B1 | 2/2003 | Baxter | ............... | 326/39 |
| 6,526,563 B1 | 2/2003 | Baxter | ............... | 716/18 |
| 6,872,601 B1 * | 3/2005 | Baxter et al. | ............... | 438/129 |
| 6,938,236 B1 * | 8/2005 | Park et al. | ............... | 716/17 |
| 6,988,258 B2 * | 1/2006 | Tan et al. | ............... | 716/17 |

OTHER PUBLICATIONS

Xilinx, *HardWire Data Book*, "XC3300 Family HardWire Logic Cell Arrays," Preliminary Product Specification, 1991.

Xilinx, *HardWire Data Book*, pp. 1-1 through 2-28, 1994.

* cited by examiner

METHOD FOR PROGRAMMING A MASK-PROGRAMMABLE LOGIC DEVICE AND DEVICE SO PROGRAMMED

CROSS REFERENCE TO RELATED APPLICATIONS

This claims the benefit of copending, commonly-assigned U.S. Provisional Patent Applications Nos. 60/480,917 and 60/483,525, filed Jun. 23, 2003 and Jun. 26, 2003, respectively, each of which is hereby incorporated herein by reference in its respective entirety.

BACKGROUND OF THE INVENTION

This invention relates to mask-programmable logic devices, and more particularly to a method for programming a mask-programmable logic device that allows migration to and from a user-programmable logic device to allow easier verification and/or testing.

Programmable logic devices, sometimes known as "field-programmable gate arrays" ("FPGAs") are well known. Early programmable logic devices were one-time configurable. For example, configuration may have been achieved by "blowing"—i.e., opening—fusible links. Alternatively, the configuration may have been stored in a programmable read-only memory. These devices generally provided the user with the ability to configure the devices for "sum-of-products" (i.e., "product term" or "P-TERM") logic operations. Later, such programmable logic devices incorporating erasable programmable read-only memory (EPROM) for configuration became available, allowing the devices to be reconfigured.

Still later, programmable logic devices incorporating static random access memory (SRAM) elements for configuration became available. These devices, which also can be reconfigured, store their configuration in a nonvolatile memory such as an EPROM, from which the configuration is loaded into the SRAM elements when the device is powered up. These devices generally provide the user with the ability to configure the devices for look-up table-type logic operations. At some point, such devices began to be provided with embedded blocks of random access memory that could be configured by the user to act as random access memory, read-only memory, or logic (such as P-TERM logic). More recently, such devices have been provided with specialized functional blocks, such as multipliers and multiplier/accumulator blocks for digital signal processing.

In all of the foregoing programmable logic devices, both the logic functions of particular logic elements in the device, and the interconnect for routing of signals between the logic elements, were programmable. Such devices will be referred to hereinbelow as "conventional programmable logic devices" or "user-programmable logic devices" or "field-programmable logic devices," with the latter not to be confused with the term "field-programmable gate array" which is considered to be a subset of the type of device described by the three foregoing terms.

More recently, mask-programmable logic devices have been provided. With mask-programmable logic devices, instead of selling all users the same device, the manufacturer manufactures a partial device with a standardized arrangement of logic elements whose functions are not programmable by the user, and which lacks any routing or interconnect resources.

To program a mask-programmable logic device, the user provides the manufacturer of the mask-programmable logic device with the specifications of a desired device, which may be the configuration file for programming a comparable conventional programmable logic device. The manufacturer uses that information to add metallization layers to the partial device described above. Those additional layers program the logic elements by making certain connections within those elements, and also add interconnect routing between the logic elements. Mask-programmable logic devices can also be provided with embedded random access memory blocks, as described above in connection with conventional programmable logic devices. In such mask-programmable logic devices, if the embedded memory is configured as read-only memory or P-TERM logic, that configuration also is accomplished using the additional metallization layers.

While conventional programmable logic devices allow a user to easily design a device to perform a desired function, a conventional programmable logic device invariably includes resources that may not be used for a particular design. Moreover, in order to accommodate general purpose routing and interconnect resources, and the switching resources that allow signals from any logic element to reach any desired routing and interconnect resource, conventional programmable logic devices grow ever larger as more functionality is built into them, increasing the size and power consumption of such devices. The routing of signals through the various switching elements as they travel from one routing and interconnect resource to another also slows down signals.

The advent of mask-programmable logic devices has allowed users to prove a design in a conventional programmable logic device, but to commit the production version to a mask-programmable logic device which, for the same functionality, can be significantly smaller and use significantly less power, because the only interconnect and routing resources present on the device are those actually needed for the particular design. In addition, those resources are simple metallizations, so there are no general purpose switching elements consuming space or power, or slowing down signals.

Nevertheless, heretofore the programming of mask-programmable logic devices has been accomplished by the provision to the manufacturer of the user's programming file for the user's logic design as implemented a comparable conventional programmable logic device. The manufacturer would then make its best effort to translate that design into the most efficient possible mask-programmed logic device. However, the manufacturer could not in all cases implement the design as the user would have done.

For example, a user may have wanted the device to operate at a certain frequency of operation. Or the user design may include certain numbers of certain types of components which are available in different numbers in the different devices, so that the user would design the programming differently to account for such differences. The manufacturer could not necessarily deduce such desires from the configuration file.

Moreover, a sufficiently sophisticated user might want to create a design specifically for a mask-programmable logic device. Heretofore the necessary tools have not been available to allow a user to do that.

SUMMARY OF THE INVENTION

In accordance with this invention, a method, to be implemented with suitable computer- or microprocessor-based programming equipment, is provided that allows a user to specify certain preferences in connection with the implementation of the user's logic design in a mask-programmable logic device. In accordance with another aspect of the invention, a programming tool in accordance with the invention may allow a migration of a design from one programmable logic device to another without the need to completely recompile the design. According to a still further aspect of the invention, resource constraints resulting from differences between otherwise comparable user-programmable logic devices and mask-programmable logic devices are taken into account to minimize failures in conversion of user-programmable logic device user designs into mask-programmable logic devices, or vice-versa. A user may program a design for a user-programmable logic device, debug or test it in a user-programmable logic device, and then commit it to a mask-programmable logic device. Alternatively, the user may program a design directly for a mask-programmable logic device but migrate the design to a user-programmable logic device for prototyping/testing.

One reason that the previously-known design process, in which the design was proven by the user in a user-programmable logic device before being migrated to a mask-programmable logic device by the mask-programmable logic device vendor, does not necessarily produce the best result in every case, is that mask-programmable logic devices have different resources than user-programmable logic devices—even than the most closely corresponding user-programmable logic devices.

For example, in the HardCopy™ APEX™ family of mask-programmable logic devices available from Altera Corporation, of San Jose, Calif., which is based on Altera's APEX™ family of user-programmable logic devices, the mask-programmable logic devices are based on the same floorplan as the user-programmable logic devices. Specifically, the arrangement of logic areas in any member the HardCopy™ APEX™ family of devices is the same as that in the corresponding member of the conventional APEX™ family of user-programmable logic devices.

In the conventional APEX™ user-programmable logic devices, the interconnect resources, though programmable, are fixed in number and location. Thus, each grouping of logic elements has a fixed number of programmable interconnection lines to which it can be connected. However, the corresponding HardCopy™ APEX™ mask-programmable logic devices do not have such restrictions; although there are physical limits, essentially any connection can be made using appropriate metallization. Therefore, if a user designs logic for a conventional user-programmable logic device in the APEX™ family, the user design will be optimized for the limited interconnect resources of that conventional device. Slavish copying of the interconnections from the APEX™ user-programmable logic device when migrating to a HardCopy™ APEX™ mask-programmable logic device may therefore be inefficient if the availability of essentially unlimited interconnections would allow a more efficient design.

By the same token, if a user designs a design directly for a mask-programmable logic device, but desires to test or prototype the design in a user-programmable logic device, the conversion from the mask-programmable design to the user-programmable design may not work because the mask-programmable design may rely on the ability to make unlimited connections by mask, and the limited number of interconnections available in the corresponding or compatible user-programmable logic device may not be sufficient to support the design.

These concerns are compounded in more recent devices, such as the STRATIX™ family of user-programmable logic devices, and the corresponding HardCopy™ STRATIX™ family of mask-programmable logic devices, both available from Altera Corporation. In those families of devices, there is not a one-to-one correspondence between a member of one family and the corresponding member of the other family. Although the capabilities of corresponding family members are comparable, the number or, more likely, the placement, of logic elements or modules may vary, and in addition the number of auxiliary elements, such as user memories, may differ. Therefore, a logic design designed for one type of device, might not be able to migrate to the other type of device. Or even if the design can be migrated, it may not be possible to maintain the same relative placement of elements, even though in some user designs relative placement might be important.

The present invention includes a method of having a user prepare a logic design directly for a mask-programmable logic device without first preparing it for a user-programmable logic device. The invention also includes, when doing so, taking account of any constraints of a corresponding or compatible user-programmable logic device (e.g., limited interconnection resources, or different floorplan, as discussed above), at least when the user intends to prototype or test the logic design in a user-programmable logic device, so that the desired migration of the design to a user-programmable logic device will be possible.

The invention also includes a method of programming a mask-programmable logic device by first designing a logic design for a compatible user-programmable logic device. In this method, the design is migrated to a mask-programmable logic device. As part of the method, the invention also includes taking account of any constraints of a corresponding or compatible mask-programmable logic device (e.g., fewer auxiliary resources, or different floorplan, as discussed above) when designing the user-programmable logic design, so that the desired migration to a mask-programmable logic device will be possible.

As an extension of the latter method, after designing the logic design in a user-programmable logic device and migrating it to a mask-programmable logic device, the user may desire to migrate the design back to a user-programmable logic device for prototyping/testing. In accordance with this extension, the method of the invention includes, having designed the original user-programmable logic design while taking account of constraints of the ultimate target mask-programmable logic device, further taking account, when migrating the design to a mask-programmable logic device, of constraints of the compatible user-programmable logic device, at least when the user intends to re-migrate the logic design to a user-programmable logic device for prototyping/testing, so that the desired re-migration of the design to a user-programmable logic device will be possible.

The invention further includes providing a transformation that will convert a design for a mask-programmable logic device, that has been converted from a configuration file for a user-programmable logic device, back into a configuration file for a user-programmable logic device, as way of testing the original conversion to a mask-programmable logic device. As long as the conversion-back transformation is not merely a mirror image of the original transformation (and it is preferable that it not be), if the configuration file resulting from the transformation back operates as intended, then the original conversion can be assumed to have been valid. The configuration file resulting from the transformation back can be tested by simply comparing it to the original configuration file, by simulating its operation in software using known techniques, or by actually programming a user-programmable logic device and testing the operation of the device. If the files are merely compared, identity may be proof of validity, and no further testing would be necessary. However, because more than one design may be functionally identical, lack of identity is not proof of invalidity and therefore a failed comparison preferably is followed up by a simulation, or by testing in an actual device.

In order to facilitate the foregoing methods, the invention includes a further method of creating and maintaining mappings between different programmable logic devices. As stated above, the designs of early mask-programmable logic devices maintained essentially a one-to-one correspondence with the compatible user-programmable logic devices. This made it easy to maintain, for example, spatial relationships among various logic elements (e.g., when the user invokes the LogicLock™ function available from Altera Corporation to keep certain logic functions physically near each other when synthesizing a design). However, as also stated above, newer mask-programmable logic device designs deviate from one-to-one correspondence with compatible user-programmable logic devices.

Thus, a user-programmable logic device may include a 5×4 array of blocks of logic elements or modules, while its corresponding mask-programmable logic device may include a 7×3 array of blocks of logic elements or modules. It will not be possible to include all of the five blocks in the leftmost column of a design for the user-programmable logic device in the leftmost column of the mask-programmable logic device, because that column includes only three blocks. The same may be true even when moving from one user-programmable logic device to another, or from one mask-programmable logic device to another.

This is addressed according to the present invention by a method of mapping one programmable logic device to another, so that as between any two devices, it is known how to map the functions in a logic block of one device to a logic block in the other device. Thus in the 7×3 vs. 5×4 example above, it will be known which of the five blocks will not be mapped to the first column, and moreover it will be known to where they will be mapped. The mapping may be done by hand or using an automated process that examines various alternatives and selects the most optimum mapping, taking into account the potential need to maintain nearest-neighbor relationships, and/or relationships between logic blocks and input/output blocks. As between any two devices, the mapping need be done only once, and then the mapping may be used to migrate any design from one device to the other (subject to the other constraints discussed above, if applicable). Because each mapping need be performed only once for each device pair, doing the mapping by hand may be feasible.

This mapping invention applies whether any one device is mask-programmable or user-programmable. That is, mappings can be prepared between a specific user-programmable logic device and a specific mask-programmable logic device, between a specific user-programmable logic device and a different specific user-programmable logic device, or between a specific mask-programmable logic device and a different specific mask-programmable logic device.

Thus, in accordance with the present invention, there is provided a method of programming a mask-programmable logic device to create a mask-programmed logic device that performs one or more desired functions. The method includes designing, for a user-programmable logic device compatible with the mask-programmable logic device, programming to perform the one or more desired functions, thereby creating one or more user-programmable logic device configuration files. The one or more user-programmable logic device configuration files are operated on using a first transformation function to create programming for the mask-programmable logic device including one or more mask-programmable logic device configuration files.

In addition, there is provided a method of programming a mask-programmable logic device to create a mask-programmed logic device that performs one or more desired functions. The method includes designing programming for the mask-programmable logic device to perform the one or more desired functions, thereby creating one or more mask-programmable logic device configuration files. The one or more mask-programmable logic device configuration files are operated on using a transformation function to create programming for a user-programmable logic device compatible with said mask-programmable logic device, including one or more user-programmable logic device configuration files.

Further, there is provided a method of creating programming that is compatible with more than one programmable logic device. The method includes designing programming for a first programmable logic device, wherein the designing comprises basing that programming at least in part on at least a second programmable logic device.

programmable logic devices programmed in accordance with the foregoing methods also are provided. dr

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention changes the flow of the programming process for mask-programmable logic devices ("MPLDs"). Rather than simply taking a user configuration file for a conventional user-programmable PLD ("UPLD") and having the MPLD supplier make its own judgment as to how the user would want the design implemented in an MPLD, the present invention provides enhanced user tools that allow more of the process to occur under user control, and that allow the user to input additional information during the process.

In order to further enhance the process, the enhanced tools in accordance with the invention preferably incorporate-enhanced models of MPLD characteristics as discussed below.

The invention will now be described with reference to FIGS. 1-7.

Figure 1:
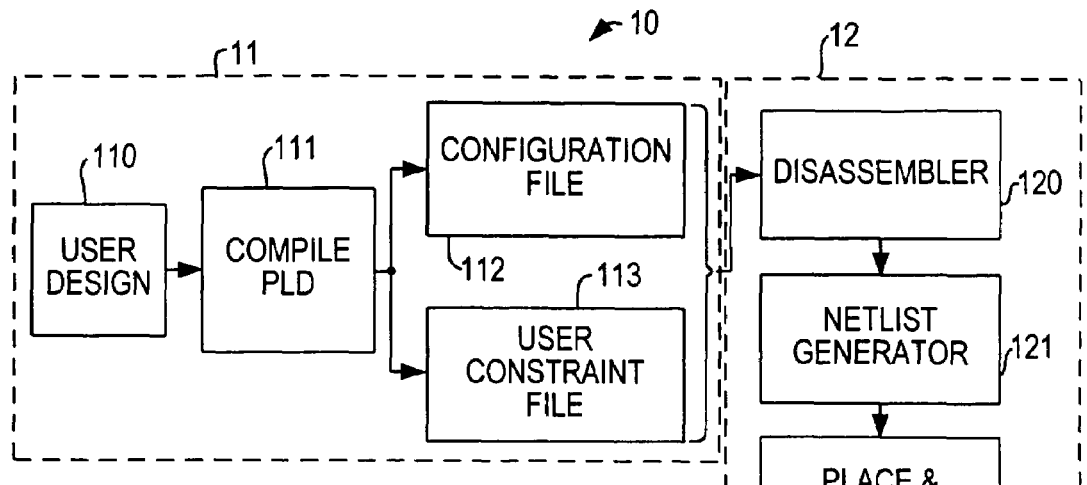
FIG. 1 is a flow diagram showing a previously-known programming method for a mask-programmable logic device.

FIG. 1 shows a previously known method 10 of programming an MPLD. Those portions of the process that occur under user control are shown in dashed box 11, while those steps that occur under the control of the MPLD supplier are shown in dashed box 12. Method 10 presupposes that the MPLD to be programmed is an MPLD counterpart to a conventional UPLD, preferably from the same supplier.

At step 110, the user enters a design for a conventional UPLD, using the design tools provided by the supplier for that purpose, as is well known. At step 111 those tools compile the user design into a configuration file 112. This preferably is the bitstream file that preferably contains the values (1's and 0's) to be assigned to each configuration bit of the UPLD for which the user developed the design. A second file 113 may be generated containing a list of user constraints (e.g., the desired operating frequency of the device). Preferably, the data in file 113 are incorporated into file 112, which is provided to supplier process 12.

At step 120, configuration file 112 preferably is disassembled. Using knowledge of which model of UPLD the design was developed on, and the effect of each configuration bit on that UPLD, disassembler 120 can determine the logical functions that the design is to perform. That information allows netlist generation step 121 to create a netlist of the functions to be provided on the programmed MPLD. The netlist preferably is processed at place-and-route step 122, preferably using conventional place-and-route tools, which are well known, such as the APOLLO-II™ place-and-route tool available from Synopsys, Inc., of Mountain View, Calif. (formerly available from Avanti Corp., of San Jose, Calif.). The results of place-and-route step 122 are used at step 123 to create the necessary metallizations to program the MPLD. A timing report 1220 may be produced after place-and-route step 122 that the user can use to verify that the desired timing relationships have been achieved.

In deciding to convert a UPLD design to an MPLD, a user is frequently expecting to reap the performance rewards of the conversion. For example, a programmed MPLD performing certain functions may operate faster and/or cooler (at lower power) than a corresponding programmed UPLD. However, it may be possible—e.g., by location of functions in particular logic blocks and selection of particular routing for particular signals—to bias the performance improvements toward one particular improvement over another (e.g., speed over power consumption, or vice-versa). When the supplier gets configuration file 112 in method 10, the supplier has very little information on which consideration, if any, is more important to the user. While the supplier can make educated guesses about the user's desires based on the design, those guesses may be wrong, resulting in an MPLD design that, while functional, may be suboptimal from a user perspective.

Figure 2:
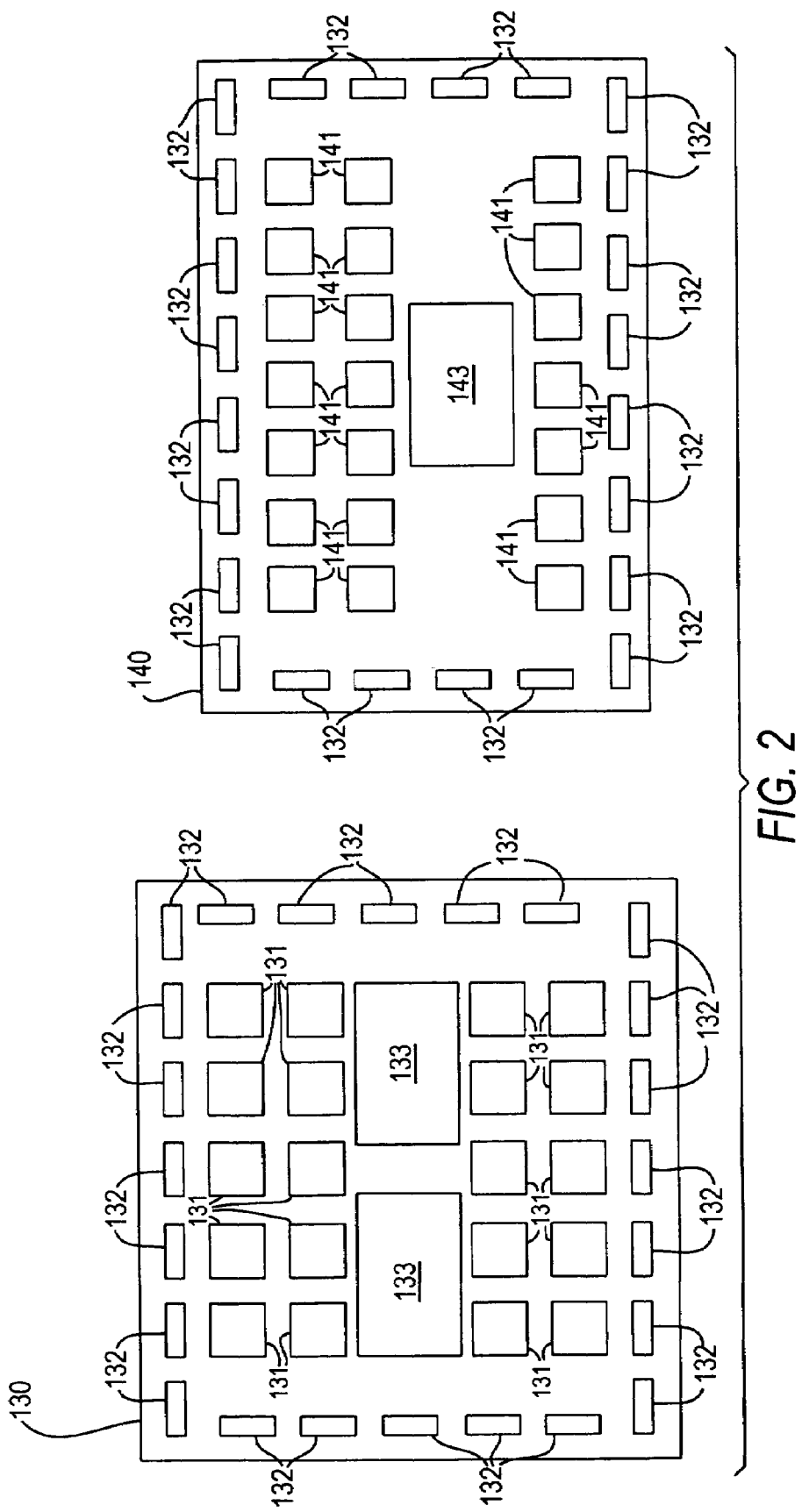
FIG. 2 is a comparative diagram showing potential differences between a mask-programmable logic device and a user-programmable logic device.
Figure 4:
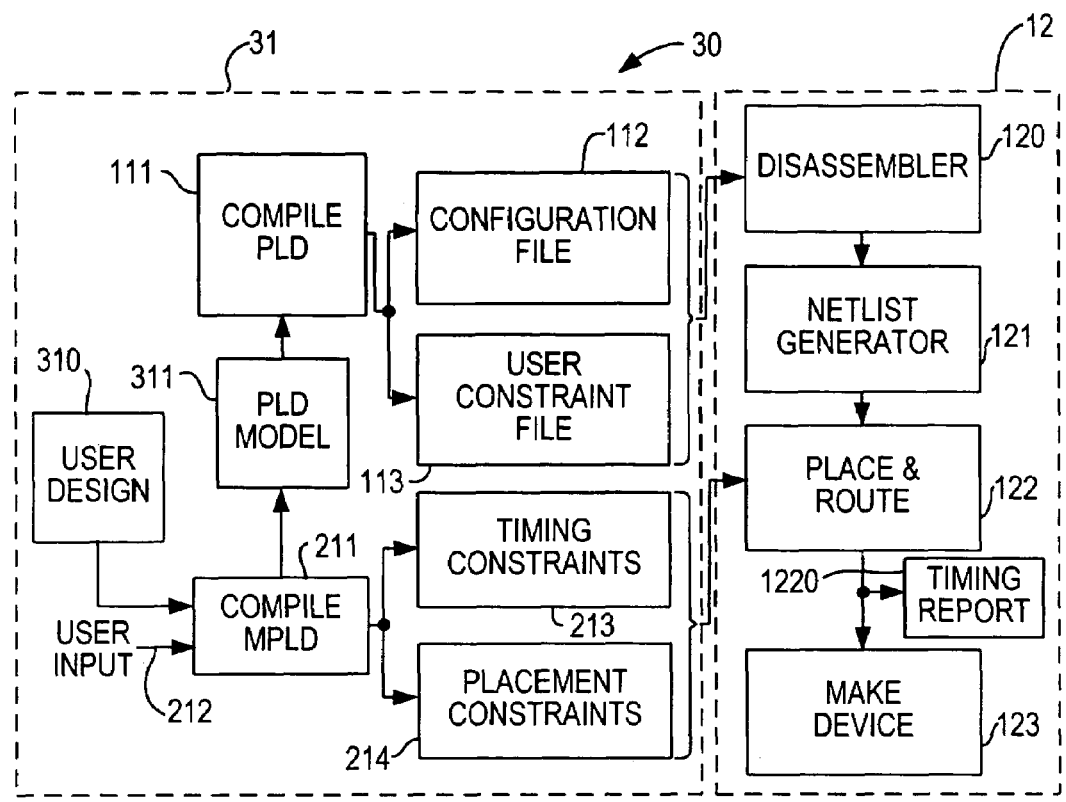
FIG. 4 is a flow diagram showing a second preferred embodiment of a programming method, in accordance with the present invention, for a mask-programmable logic device.
Figure 5:
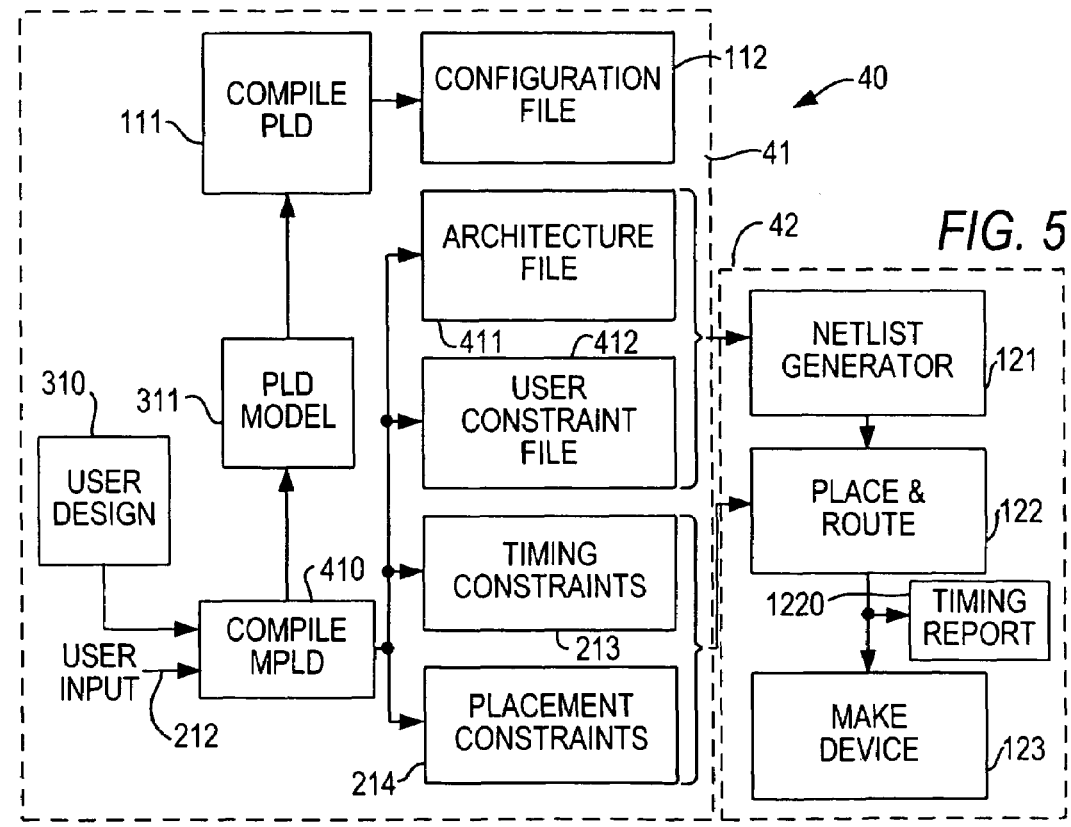
FIG. 5 is a flow diagram showing a third preferred embodiment of a programming method, in accordance with the present invention, for a mask-programmable logic device.

FIG. 2 compares two devices. Device 130 is a hypothetical UPLD having twenty blocks 131 (e.g., of ten logic elements or modules each) arranged in a 5×4 configuration, while device 140 is a corresponding compatible MPLD having twenty-one blocks 141 of logic elements or modules arranged in a 7×3 configuration. Although they may have different die sizes, as compatible devices, each device 130, 140 must fit into the same external environment. Therefore each preferably has the same package and pinouts, although the arrangement of input/output drivers 132 may differ. In this example, devices 130, 140 differ further in that UPLD device 130 has two user memories 133, while MPLD device 140 has only one user memory 143. Other differences may also exist between actual pairs of devices. And all UPLDs differ from all MPLDs in that the available routing on a UPLD is only that programmable interconnect structure provided by the manufacturer, while the only limits on routing in an MPLD are those resulting from the potential inability to lay out the metallizations for some complicated routing plan desired by some user (e.g., because two many signal paths have to cross one another than can be accommodated by the available layers of metallization).

When a user designs a design for UPLD 130, the user might have in mind that certain functions that produce signals used outside the device need to be nearer to the input/output regions 132, but also that certain logic functions that use one another's results also should be near one another. Because of the different layout of the logic blocks 131, 141, both of those goals might not be obtainable when migrating the user design to MPLD 140.

Method 20 (FIG. 3) according to the invention attempts to give more weight to user desires by giving the user more control over the process. Thus in user portion 21 of method 20, after the UPLD design is compiled in step 111, the results are output not only to configuration file 112, but also to an MPLD model 210 in which the characteristics and responses of the corresponding MPLD—including the actual layout or "floorplan" of the MPLD—are represented, in effect translating UPLD functions to MPLD functions, which preferably are compiled at step 211. Preferably, the same compiling tool, preferably using the same algorithm and/or code base, is used in UPLD compiling step 111 and MPLD compiling step 211 (and MPLD compiling step 410—see FIG. 5). It should be noted that by using the same compiler on the same user design, there is a high degree of confidence, without complex verification, that a design that works in a UPLD will work in an MPLD. MPLD model 210 may be based on a device-to-device mapping as described below in connection with FIG. 7.

The result of step 211 is a file 213 of timing constraints for the programmed MPLD, and a file 214 of placement constraints for the programmed MPLD. The user may provide input 212 to step 211 to guide the compilation at step 211. For example, if one of the user's goals is to have a certain clock run 0.50% faster in the MPLD version than in the UPLD version, that can be entered by the user at step 211, which then will "know" to favor speed over, e.g., reduced power consumption.

While files 112, 113, which may, as above, be a single file, are provided to disassembler 120 as in method 10, files 213 and 214, which also may be a single file, and which contain timing and placement data for the MPLD, are provided to place and route step 122. In particular, these data include timing constraints that can be met by the MPLD that could not have been met by the UPLD (and therefore are not reflected in file(s) 112/113) and placement constraints based on "knowledge" of the layout structure of the MPLD. With these data, the place-and-route tools have less to do, as the place function already has been performed. Thus, preferably the place-and-route tools perform substantially only routing, and then the MPLD is made at step 123 as above.

In method 20, the user, as in method 10, defines the desired MPLD in terms of the corresponding UPLD. However, in designing the UPLD programming, the constraints of the ultimate target MPLD must be taken into account. Thus, part of the user input in UPLD design step 110 is an indication of whether or not the design is ultimately intended for an MPLD. If it is, the constraints of the MPLD are take into account—i.e., the design tool does not allow use of UPLD functions that would accomplish the desired logic design, but would not be available in a compatible MPLD because, e.g., of differences of the type described above between UPLDs and MPLDs even when they are compatible with one another.

In another preferred embodiment of the invention, in user portion 31 of method 30 (FIG. 4), the user defines the desired MPLD in terms of the MPLD itself in user design 310. This optimizes the design for the MPLD, because the design is created with the structure of the MPLD directly in mind in terms of the numbers and positioning of the various resources.

Design 310, and user inputs 212 of MPLD constraints such as, again, desired operating frequency, are input to MPLD compiler step 211, which again outputs timing and placement constraints 213, 214. The output of step 211 is also input at step 311 to a model in which the characteristics and responses of the corresponding UPLD are represented, in effect translating MPLD functions to UPLD functions, which preferably are compiled at step 111. Step 111 again generates UPLD configuration and constraint data 112, 113. Data 112, 113, 213, 214 are used in supplier portion 12 of method 30 just as they are in supplier portion 12 of method 20.

In addition, data 112, 113 are available in the event that the user wants to program a UPLD to simulate the desired MPLD before committing to having the supplier make the programmed MPLD at step 123. However, if the user intends to perform such a verification in a UPLD, then the user preferably should indicate as part of inputs 212 that UPLD verification will be done. In such a case, the constraints of the UPLD are take into account—i.e., the design tool does not allow use of MPLD functions that would accomplish the desired logic design, but would not be available in a compatible UPLD because, e.g., of differences of the type described above between UPLDs and MPLDs even when they are compatible with one another.

In a further preferred embodiment of a method 40 shown in FIG. 5, the user again in user portion 41 defines the desired MPLD in terms of the MPLD itself in user design 310. That design 310, and user inputs 212 of MPLD constraints such as, again, desired operating frequency, are input to MPLD compiler step 410, which again outputs timing and placement constraints 213, 214, as well as architecture file 411 and user constraint file 412. In this case, the MPLD design does not have to be converted to a UPLD design simply to provide configuration and constraint files 112, 113 for use by a disassembler 120. Instead architecture and constraint files 411, 412 provided by compiler step 411 are used directly by netlist generator 121 of supplier portion 42 of method 40, which needs no disassembler 120. However, the output of compiler step 410 may optionally be input at step 311 to a model in which the characteristics and responses of the corresponding UPLD are represented, in effect translating MPLD functions to UPLD functions, which may then be compiled at step 111. Step 111 in this case generates UPLD configuration data 112, which can be used, if desired, to program a UPLD to simulate the desired MPLD before committing to having the supplier make the programmed MPLD at step 123. Again, if the user intends to perform such a verification in a UPLD, then the user preferably should indicate as part of inputs 212 that UPLD verification will be done. In such a case, the constraints of the UPLD are take into account, as discussed above in connection with method 30 (FIG. 4).

It should be noted in connection with any of methods 20, 30 and 40 that if the user designs logic for one kind of device (UPLD or MPLD) with the intention that the logic be convertible to the other type of device (MPLD or UPLD), then not only would the software not allow the use of functions that would not be able to be translated from one device to another, but it preferably also would check the required number of each kind of resource in the source and target devices and limits allowable conversions to those in which those numbers intersect—i.e., to those in which there is no category of resource for which the number used in the source device exceeds the number available in the target device. Thus, for a design that uses fewer than all resources in a source device, that design might be convertible to a particular target device, but a different design in the same source device that uses more of one or more types of resources might not be convertible to that same particular type of target device.

This aspect of the invention, which may be applied, for example, at the synthesis stage of compiling step 111, preferably advises the user of a predicted failure when the design is entered, rather than having to wait for an attempted conversion to fail, which may be several hours later. If such a failure is predicted, the software may switch to, or advise the user to switch to, the next larger available target device. Alternatively, particularly where the largest available target device is already being considered, then for certain functions, that are implemented in one kind of resource in the source device of which there are too few in the target device, the software will implement certain functions, or recommend that user implement those functions, in different kinds of resources, if possible.

Similarly, in migrating a function that was implemented on the source device in a particular type of resource, the software preferably will not attempt to implement that function in the same type of resource on the target device when the target device lacks that type of resource; instead it will model that function in other types of resources that are available. Note that this is true not only when migrating between UPLDs and MPLDs, but even among devices of the same type that have different resources.

Figure 3:
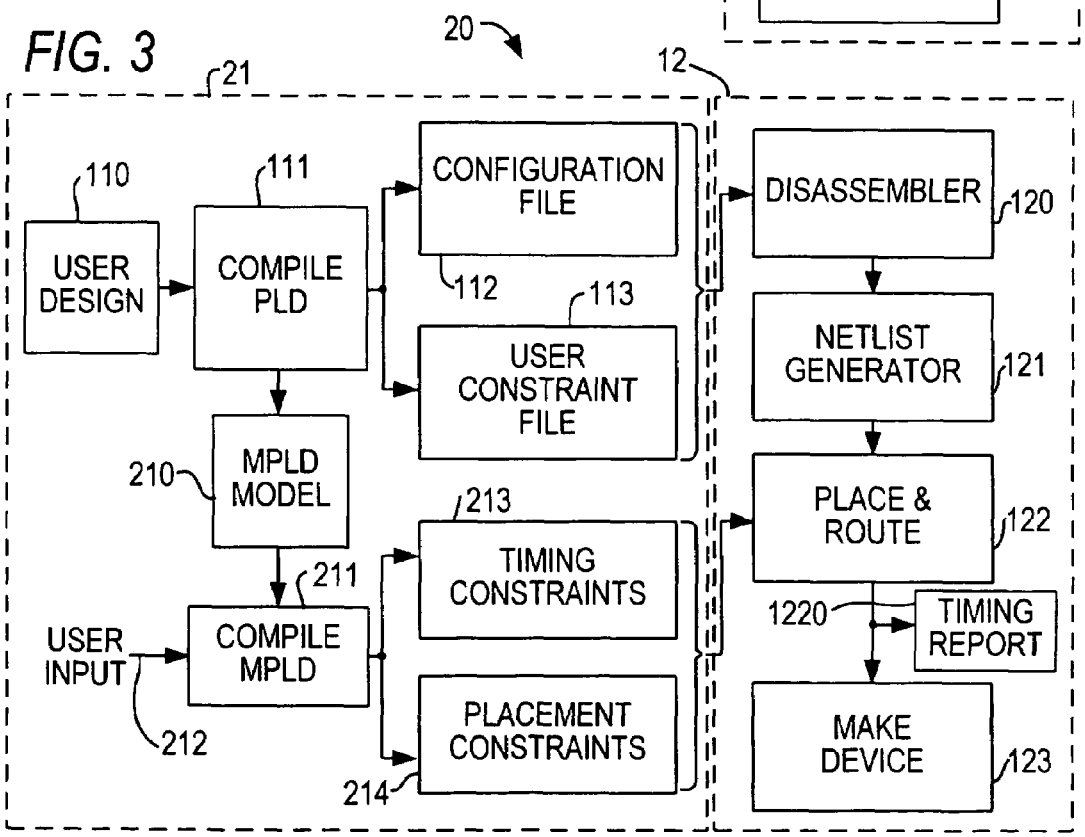
FIG. 3 is a flow diagram showing a first preferred embodiment of a programming method, in accordance with the present invention, for a mask-programmable logic device.
Figure 6:
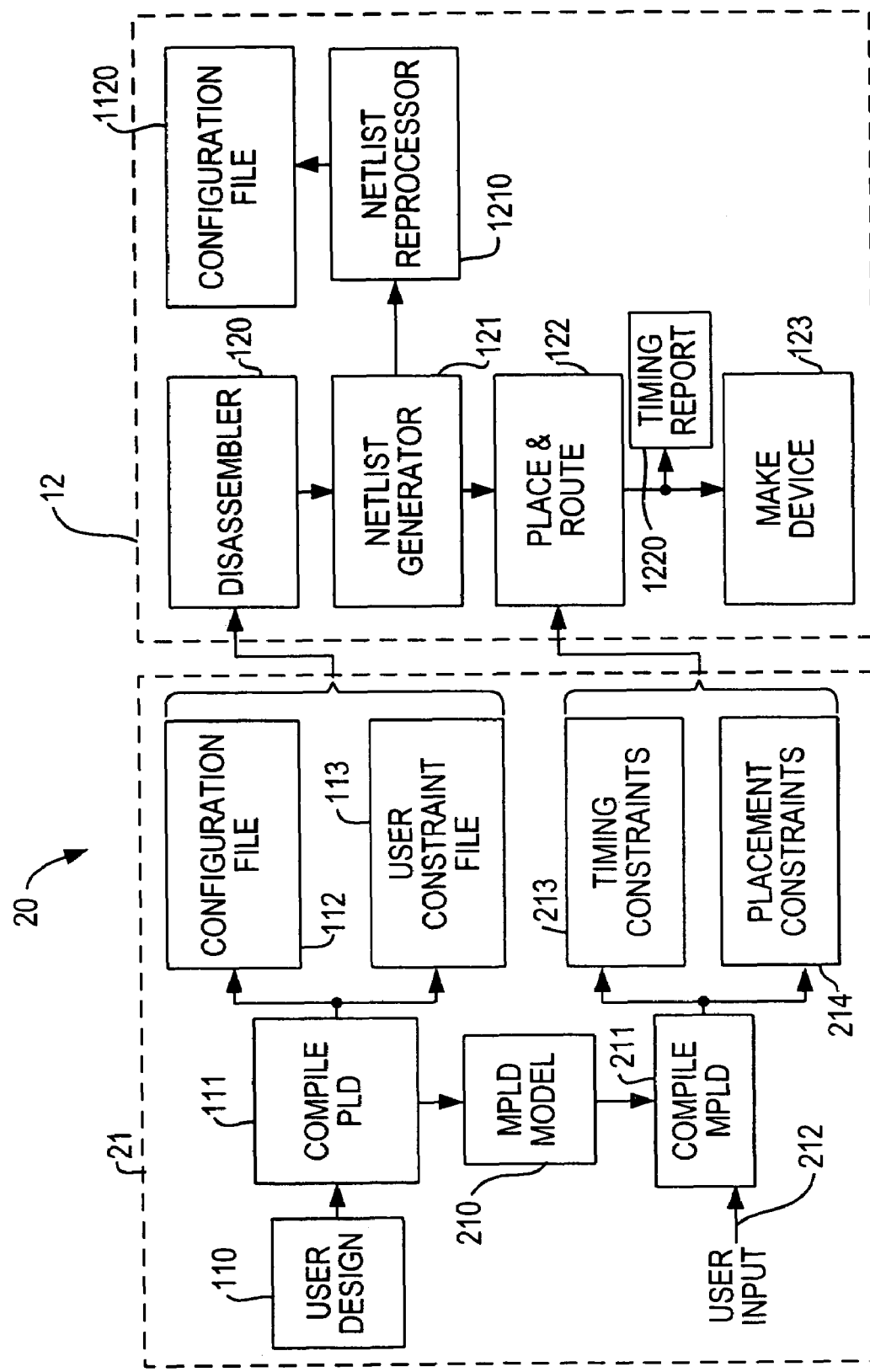
FIG. 6 is a flow diagram similar to FIG. 3 with an added verification step.

FIG. 6 shows a method 60 similar to method 20 of FIG. 3, wherein the user designs the logic for a UPLD and that logic design is then converted for use in an MPLD by disassembling configuration file 112 at step 120 to create a netlist at step 121, which is then placed and routed on the MPLD at steps 122, 123. In accordance with this aspect of the invention, as a verification, the resulting netlist is reprocessed at step 1210 to generate a new UPLD configuration file 1120. Configuration file 1120 can then be tested at step 1121 to see if a UPLD programmed with that file will operate in accordance with the design.

Testing step 1121 may take several forms. At one extreme, configuration file 1120 could be used directly to program a UPLD, whose functions can then be compared to the design specification sought to be met. At the other extreme, configuration file 1120 could simply be compared to original configuration file 112. If the files are identical, the inquiry ends there. However, if files 112 and 1120 are not identical, they still may result in devices that function identically. Therefore, further testing is necessary, which can be performed as a simulation, or by actually programming a device.

Reprocessing step 1121 should not be a simple mirror image of step 121. Otherwise, file 1120 will always be identical to file 112 and errors in the resulting MPLD will not detectable. Rather, step 1121 preferably is written independently to convert the netlist at step 121 back into a configuration file 1120.

As discussed above, models 210, 311 are provided to model conversions between UPLDs and MPLDs or vice-versa (and similar models may be used to convert among different UPLDs or among different MPLDs). According to a preferred embodiment of this invention, models 210, 311 (and any similar models) may be based on mappings of pairs of devices. These mappings are set up ahead of time for selected pairs of devices between which the need to map logic designs is foreseen. Thus, in particular, such mappings may be created for each MPLD and its corresponding or compatible UPLD. In some such cases, the mappings will be a one-to-one correspondence, such as in the case of Altera Corporation's APEX™ and HardCopy™ APEX™ products. In other types of devices, such as Altera Corporation's STRATIX™ and HardCopy™ STRATIX™ products, where the number and layout of resources differ as between corresponding or compatible devices, the mapping might be more complex, but preferably would be designed to maintain nearest-neighbor relationships, including relationships between I/O blocks and logic blocks, so that designs migrated from one device to another operate as desired. This preferably is so even where the aspect ratios of the devices differ. For example, if a UPLD having 100-by-100 logic blocks is mapped to an MPLD having 500-by-20 logic blocks, it is desirable to maintain nearest-neighbor relationships, and relationships between logic and I/O to maintain performance.

Consider, for example, a UPLD logic block in the rightmost column of logic blocks that is placed in that column so that is near an I/O block and a particular other logic block. Although there are only one-fifth as many logic blocks in the rightmost column of the target MPLD, in accordance with the invention a logic block in the rightmost column of the source device is preferably constrained to at least remain in one of the five rightmost columns of the target device if it cannot be in the rightmost column of the target device. The other logic block which is intentionally placed near the first logic block in the source device will also preferably be kept near the first logic block in the target device. One preferred way of accomplishing this is to maintain a one-to-one correspondence between individual elements (e.g., logic blocks) in the two layouts.

Figure 7:
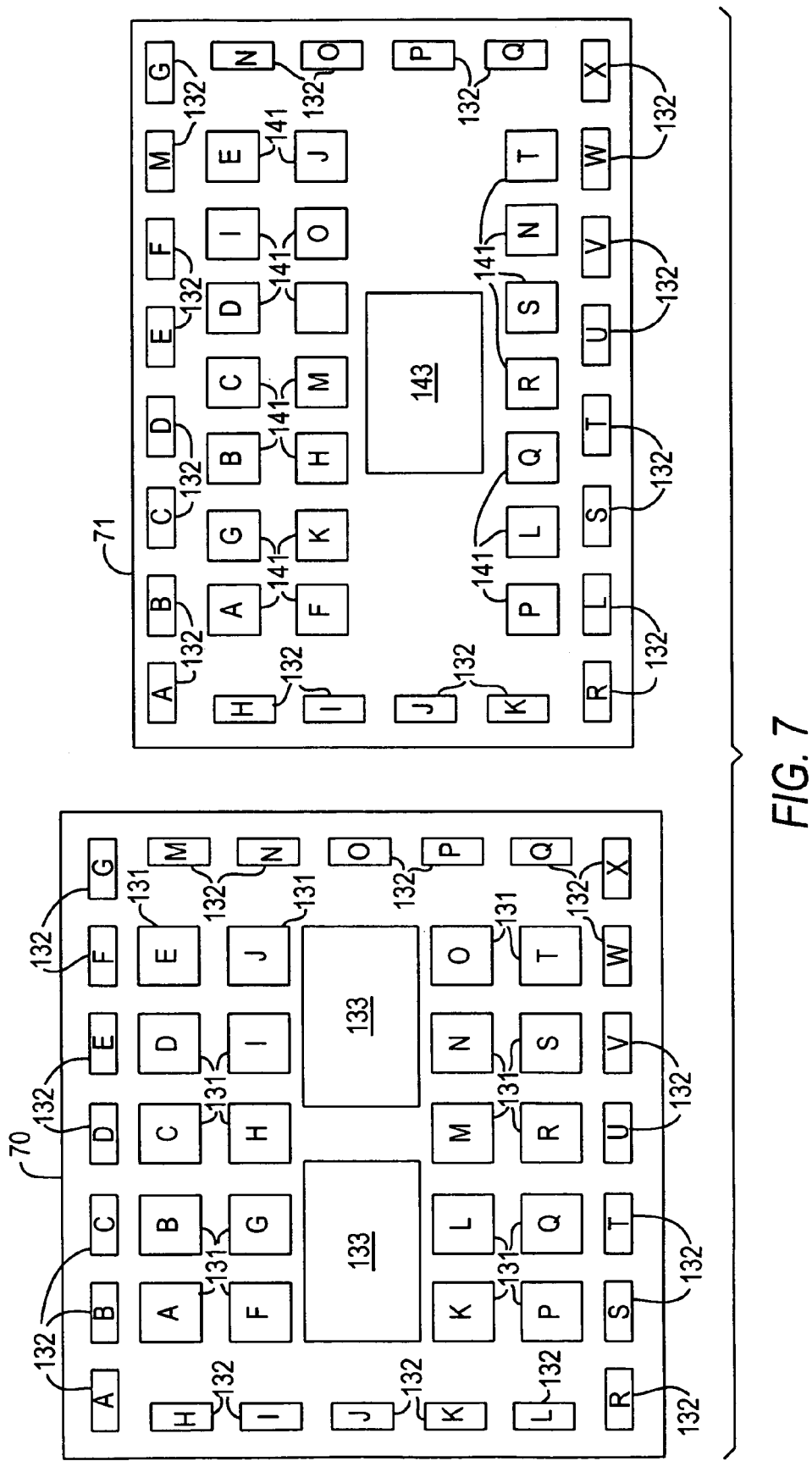
FIG. 7 is a diagrammatic representation showing differences in layout between compatible programmable devices, showing mapping in accordance with the present invention.

A smaller example is illustrated in FIG. 7, which shows the differences, and mapping, between a 5×4 UPLD 70 and a 7×3 MPLD 71 as discussed above, with mapped input/output blocks, mapped logic blocks, and mapped memories, being similarly labelled. It can be seen that some logic blocks that in device 70 were in, e.g., the first column, and thus were close to input/output blocks 132 are in, e.g., the second column in device 71, and thus further from input/output blocks 132. At least where device 70 is a UPLD and device 71 is an MPLD, these placement differences should not significantly affect timing because in the MPLD the signals are travelling on simple metallizations, and therefore travel faster than the signals on the UPLD interconnect.

It may be possible to automate the mapping process. However, the mappings can be done by hand, and because each mapping is on a device-pair basis, and is used to map all conversions between devices in that pair, it only needs to be created once, making hand-mapping acceptable. Once the mapping is done, any conversion between the devices in that pair can be accomplished simply by following the mapping. This aspect of the invention also can be used to map one UPLD-to-MPLD conversion to a different UPLD-to-MPLD conversion (i.e., where the "target" MPLD changes), or even to map from one UPLD to another UPLD, where the alternate target device has different dimensions, layout and number of resources than the original target device, as long as a mapping has previously been prepared. This aspect of the invention is particularly useful where the original design is for a UPLD, because it preferably relies on the compiled UPLD design as a starting point for the new target design. This avoids the need to run the place-and-route step on the new design which may take several hours. By using the compiled UPLD design, the alternative mapping can be displayed to the user in a relatively short time.

Along the same lines, in accordance with another aspect of the invention, it has been observed that in a given family of PLDs and corresponding MPLDs, the MPLDs may have different numbers of certain types of resources such as the various types of logic blocks and memory elements. In accordance with this aspect of the invention (not shown), preferably the user software checks the required number of each kind of resource in the source and target devices and limits allowable conversions to those in which those numbers intersect—i.e., to those in which there is no category of resource for which the number used in the source device exceeds the number available in the target device. Thus, for a design that uses fewer than all resources in a source device, that design might be convertible to a particular target device, but a different design in the same source device that uses more of one or more types of resources might not be convertible to that same particular type of target device.

This aspect of the invention, which may be applied, for example, at the synthesis stage of compiling step 111, preferably advises the user of a predicted failure when the design is entered, rather than having to wait for an attempted conversion to fail, which may be several hours later. If such a failure is predicted, the software will either switch to, or advise the user to switch to, the next larger available target device. Alternatively, particularly where the largest available target device is already being considered, then for certain functions, that are implemented in one kind of resource in the source device of which there are too few in the target device, the software will implement certain functions, or recommend that user implement those functions, in different kinds of resources, if possible. Similarly, in migrating a function that was implemented on the source device in a particular type of resource, the software will not attempt to implement that function in the same type of resource on the target device when the target device lacks that type of resource; instead it will model that function in other types of resources that are available. Note that this is true not only when migrating between PLDs and MPLDs, but even among devices of the same type that have different resources.

Figure 8:
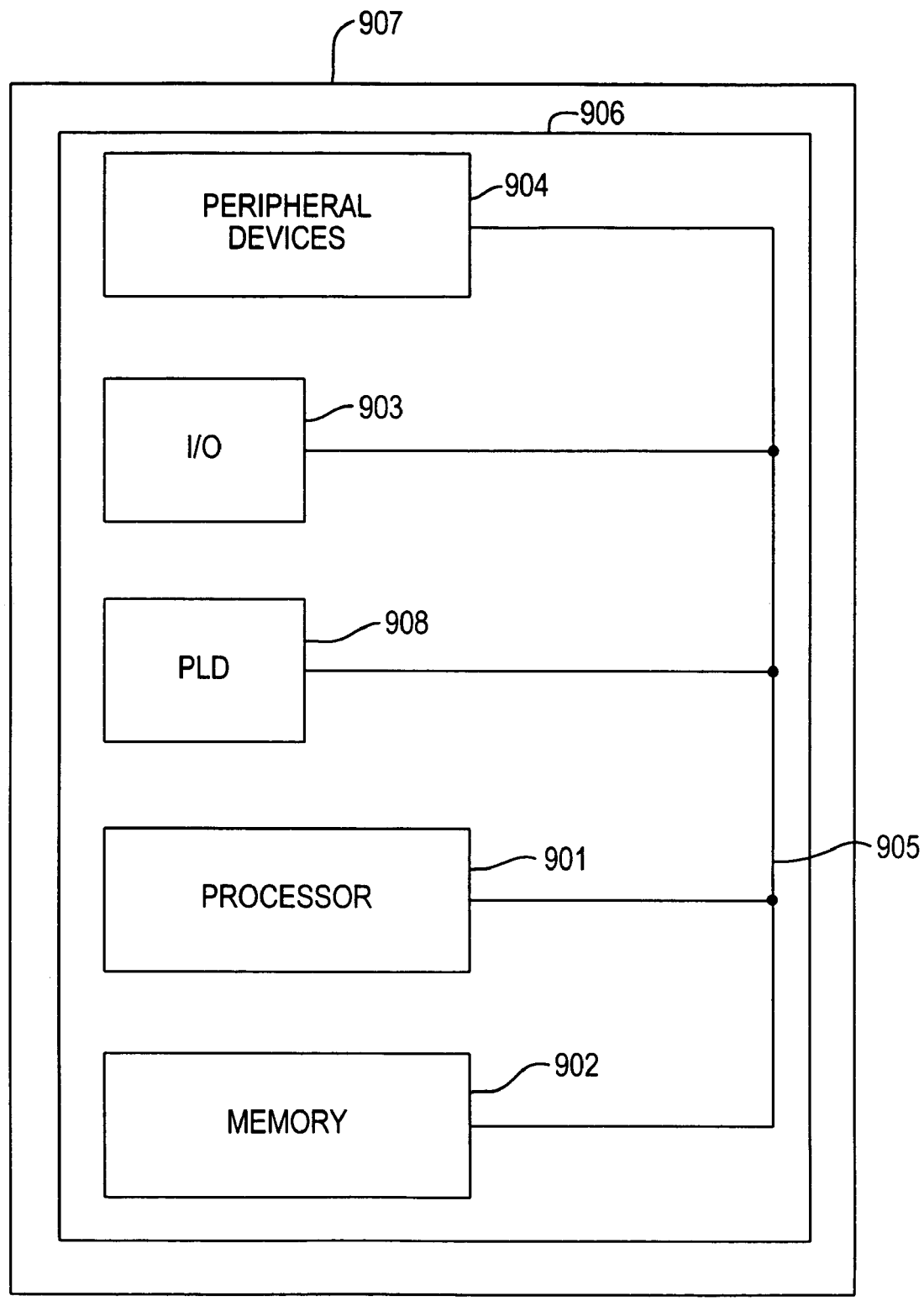
FIG. 8 is a simplified block diagram of an illustrative system employing a mask-programmable logic device programmed in accordance with the present invention.

A device programmed in accordance with the present invention may be used in many kinds of electronic devices. One possible use of, e.g., PLD 908 (an MPLD or UPLD) is in a data processing system 900 shown in FIG. 8. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 908 can be used to perform a variety of different logic functions. For example, PLD 908 can be configured as a processor or controller that works in cooperation with processor 901. PLD 908 may also be used as an arbiter for arbitrating access to a shared resources in system 900. In yet another example, PLD 908 can be configured as an interface between processor 901 and one of the other components in system 900. It should be noted that system 900 is only exemplary.

Various technologies can be used to implement PLDs and MPLDs as described above and with which this invention is used.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A method of programming a mask-programmable logic device to create a mask-programmed logic device that performs one or more desired functions, said method comprising:
   designing, for a user-programmable logic device compatible with said mask-programmable logic device, programming to perform said one or more desired functions, thereby creating a user-programmable logic device programming file and one or more user-programmable logic device configuration files;
   operating on said user-programmable logic device programming file using a first transformation function to create programming for said mask-programmable logic device including one or more mask-programmable logic device configuration files; and
   processing said one or more user-programmable logic device configuration files and said one or more mask-programmable logic device configuration files to create said mask-programmed logic device.

2. The method of claim 1 wherein said processing comprises:
   disassembling at least one of said at least one user-programmable logic device configuration files to generate a netlist.

3. The method of claim 2 wherein said processing further comprises:
   inputting said netlist to a place and route tool.

4. The method of claim 3 wherein said processing further comprises:
   inputting said at least one mask-programmable logic device configuration file to said place and route tool.

5. The method of claim 1 wherein said at least one user-programmable logic device configuration file comprises at least a bitstream configuration file.

6. The method of claim 5 wherein said at least one user-programmable logic device configuration file further comprises a file representing user constraints.

7. The method of claim 1 wherein said at least one mask-programmable logic device configuration file comprises at least one of:
   (a) a file representing mask-programmable logic device timing constraints; and
   (b) a file representing mask-programmable logic device placement constraints.

8. The method of claim 1 further comprising testing said programming for said compatible user-programmable logic device prior to creating said mask-programmed logic device.

9. The method of claim 8 wherein said designing comprises designing said programming for said compatible user-programmable logic device based at least in part on characteristics of said mask-programmable logic device.

10. The method of claim 1 wherein said designing comprises designing said programming for said compatible user-programmable logic device based at least in part on characteristics of said mask-programmable logic device.

11. The method of claim 1 wherein said first transformation function includes a mapping between said user-programmable logic device and said mask-programmable logic device.

12. A mask-programmed logic device, programmed in accordance with the method of claim 1.

13. A digital processing system comprising:
   processing circuitry;
   a memory coupled to said processing circuitry; and
   a mask-programmed logic device, programmed in accordance with the method of claim 1, coupled to the processing circuitry and the memory.

14. A printed circuit board on which is mounted a mask-programmed logic device programmed in accordance with the method of claim 1.

15. The printed circuit board defined in claim 14 further comprising:
   memory circuitry mounted on the printed circuit board and coupled to the mask-programmed logic device.

16. The printed circuit board defined in claim 15 further comprising:
   processing circuitry mounted on the printed circuit board and coupled to the memory circuitry.

17. A method of programming a mask-programmable logic device to create a mask-programmed logic device that performs one or more desired functions, said method comprising:
   designing, for a user-programmable logic device compatible with said mask-programmable logic device, programming to perform said one or more desired functions, thereby creating one or more user-programmable logic device configuration files;
   operating on said one or more user-programmable logic device configuration files using a first transformation function to create programming for said mask-programmable logic device including one or more mask-programmable logic device configuration files;
   using a second transformation function to convert said programming for said mask-programmable logic device to derived programming for said user-programmable logic device; and testing said derived programming for said user-programmable logic device.

18. The method of claim 17 wherein said testing comprises comparing said derived programming to said programming designed for said user-programmable logic device.

19. The method of claim 17 wherein said testing comprises programming a user-programmable logic device with said derived programming and observing operation of said programmed user-programmable logic device.

20. A method of programming a mask-programmable logic device to create a mask-programmed logic device that performs one or more desired functions, said method comprising:
   designing programming for said mask-programmable logic device to perform said one or more desired functions, thereby creating one or more mask-programmable logic device configuration files;
   operating on said one or more mask-programmable logic device configuration files using a transformation function to create programming for a user-programmable logic device compatible with said mask-programmable logic device, including one or more user-programmable logic device configuration files.

21. The method of claim 20 further comprising:
   processing said one or more user-programmable logic device configuration files and said one or more mask-programmable logic device configuration files to create said mask-programmed logic device.

22. The method of claim 21 wherein said processing comprises:
   disassembling at least one of said at least one user-programmable logic device configuration files to generate a netlist.

23. The method of claim 22 wherein said processing further comprises:
   inputting said netlist to a place and route tool.

24. The method of claim 23 wherein said processing further comprises:
   inputting said at least one mask-programmable logic device configuration file to said place and route tool.

25. The method of claim 20 wherein said at least one user-programmable logic device configuration file comprises at least a bitstream configuration file.

26. The method of claim 25 wherein said at least one user-programmable logic device configuration file further comprises a file representing user constraints.

27. The method of claim 20 wherein said at least one mask-programmable logic device configuration file comprises at least one of:
   (a) a file representing mask-programmable logic device timing constraints; and
   (b) a file representing mask-programmable logic device placement constraints.

28. The method of claim 20 further comprising testing said programming for said compatible user-programmable logic device prior to creating said mask-programmed logic device.

29. The method of claim 28 wherein said operating comprises designing said programming for said compatible user-programmable logic device based at least in part on characteristics of said mask-programmable logic device.

30. The method of claim 20 wherein said operating comprises designing said programming for said compatible user-programmable logic device based at least in part on characteristics of said mask-programmable logic device.

31. The method of claim 20 wherein said designing comprises designing said programming for said mask-programmable logic device based at least in part on characteristics of said compatible user-programmable logic device.

32. The method of claim 20 wherein said transformation function includes a mapping between said user-programmable logic device and said mask-programmable logic device.

33. A mask-programmed logic device, programmed in accordance with the method of claim 20.

34. A digital processing system comprising:
   processing circuitry;
   a memory coupled to said processing circuitry; and
   a mask-programmed logic device, programmed in accordance with the method of claim 20, coupled to the processing circuitry and the memory.

35. A printed circuit board on which is mounted a mask-programmed logic device programmed in accordance with the method of claim 20.

36. The printed circuit board defined in claim 35 further comprising:
   memory circuitry mounted on the printed circuit board and coupled to the mask-programmed logic device.

37. The printed circuit board defined in claim 36 further comprising:
   processing circuitry mounted on the printed circuit board and coupled to the memory circuitry.

* * * * *